United States Patent
Åstrand

(10) Patent No.: US 8,227,098 B2
(45) Date of Patent: Jul. 24, 2012

(54) MULTILAYERED COATED CUTTING TOOL

(75) Inventor: Maria Åstrand, Storvreta (SE)

(73) Assignee: Sandvik Intellectual Property, Sandviken (SE)

( * ) Notice: Subject to any disclaimer, the term of this patent is extended or adjusted under 35 U.S.C. 154(b) by 706 days.

(21) Appl. No.: 12/003,378

(22) Filed: Dec. 21, 2007

(65) Prior Publication Data

US 2008/0166588 A1 Jul. 10, 2008

(30) Foreign Application Priority Data

Dec. 27, 2006 (SE) ...................................... 0602814

(51) Int. Cl.
*B32B 9/00* (2006.01)

(52) U.S. Cl. ............ 428/698; 51/307; 51/309; 428/216; 428/336; 428/697; 428/699; 204/192.1

(58) Field of Classification Search .................... 51/307, 51/309; 428/216, 336, 697, 698, 699; 204/192.1
See application file for complete search history.

(56) References Cited

U.S. PATENT DOCUMENTS

| | | | | |
|---|---|---|---|---|
| 6,103,357 A * | 8/2000 | Selinder et al. | ............... | 428/216 |
| 6,586,122 B2 * | 7/2003 | Ishikawa et al. | ................. | 51/307 |
| 6,824,601 B2 * | 11/2004 | Yamamoto et al. | ........... | 428/698 |
| 7,056,602 B2 * | 6/2006 | Horling et al. | ................ | 428/699 |
| 7,083,868 B2 * | 8/2006 | Horling et al. | ................ | 428/697 |
| 7,348,074 B2 * | 3/2008 | Derflinger | ...................... | 428/699 |
| 7,410,707 B2 * | 8/2008 | Fukui et al. | ..................... | 51/309 |
| 7,510,761 B2 * | 3/2009 | Kondo et al. | ................... | 51/307 |
| 7,537,822 B2 * | 5/2009 | Ishikawa | ........................ | 428/697 |
| 7,592,076 B2 * | 9/2009 | Flink et al. | ..................... | 428/697 |
| 7,597,951 B2 * | 10/2009 | Bjormander et al. | ......... | 428/336 |
| 2006/0222893 A1 | 10/2006 | Derflinger | | |
| 2007/0275179 A1 * | 11/2007 | strand et al. | ................. | 427/524 |

FOREIGN PATENT DOCUMENTS

| | | | |
|---|---|---|---|
| EP | 1 219 723 | | 7/2002 |
| EP | 1 690 959 | | 8/2006 |
| EP | 1 698 714 | A2 | 9/2006 |
| EP | 1 702 997 | | 9/2006 |
| EP | 1 726 686 | A1 | 11/2006 |
| EP | 1736565 | * | 12/2006 |
| JP | 2003-175405 | | 6/2003 |
| JP | 2006 152321 | | 6/2006 |
| JP | 2006-181706 | * | 7/2006 |
| WO | WO 2006/041366 | A1 | 4/2006 |
| WO | WO 2006/080888 | A1 | 8/2006 |

\* cited by examiner

*Primary Examiner* — Archene Turner
(74) *Attorney, Agent, or Firm* — Morgan, Lewis & Bockius LLP

(57) ABSTRACT

A coated cutting tool is disclosed having a substrate and a coating including an aperiodic, multilayered structure with an average composition of (Ti, Al, Cr, Si)N, wherein the average composition is $(Ti_{(1-a-b-c)}Al_aCr_bSi_c)N$, where $0<a<0.5$, preferably $0.05<a<0.4$ most preferably $0.25<a<0.3$, where $0<b<0.15$, preferably $0.02<b<0.10$, most preferably $0.04<b<0.08$, where $0.01<c<0.17$, preferably $0.02<c<0.10$, most preferably $0.04<c<0.08$, and $a+b+c<1$, and wherein the average thickness of the individual layers is 0.1 to 100 nm.

20 Claims, 1 Drawing Sheet

MULTILAYERED COATED CUTTING TOOL

RELATED APPLICATION DATA

This application claims priority under 35 U.S.C. §119 and/or §365 to Swedish patent application No. 0602814-6, filed Dec. 27, 2006, the entire contents of which are incorporated herein by reference.

FIELD

The present disclosure relates to a coated cutting tool wherein the coating has an aperiodic, multilayered structure consisting of (Ti,Al,Cr,Si)N.

BACKGROUND

In the discussion of the background that follows, reference is made to certain structures and/or methods. However, the following references should not be construed as an admission that these structures and/or methods constitute prior art. Applicant expressly reserves the right to demonstrate that such structures and/or methods do not qualify as prior art.

The recent development within tools has been towards sharper cutting edges. This requires thinner coatings in order to maintain the sharp cutting edge since a thick coating would result in an increased edge rounding which is detrimental for the cutting properties. A thicker coating is also more prone to spall off the edge line as a result of a higher interfacial shear force, which is more critical the sharper the edge is. If a thinner coating is deposited, an increased hardness, i.e., abrasive wear resistance, is required to maintain the wear resistance of the tool.

One way to achieve a thin, hard coating is to use a multilayered nanocomposite coating. A common coating composition for such a multilayered nanocomposite coating is (Ti,Al)N.

Another way to improve properties like hardness and oxidation resistance for PVD-coatings is by the addition of elements such as Cr, Si, B.

For Al-containing nitride PVD coatings, it is well known that a high aluminium content, >40 at %, is advantageous to obtain a high flank wear and oxidation resistance. However, a too high aluminium content also leads to increased crater wear due to the phase transformation from the metastable hard cubic phase to the more stable, soft, hexagonal phase of AlN.

Sharp edges are important in many cutting operations, e.g. in drilling operations. When drilling, wear is not only found in the cutting edge. Frequently, substantial wear is also found on the margin of the drill. Severe margin wear gives problems when the drill is going to be reconditioned, i.e., reground and recoated, as the whole worn area has to be removed. Normally when recoating a drill the total coating thickness increases for each recoating. An increased coating thickness on the margin will increase the wear on the margin, some distance away from the corner. Also, an increased coating thickness will increase the edge rounding. Hence, a thinner, more wear resistant, coating is a big advantage.

(Ti,Al,Cr,Si)N coatings on cutting tools are known in the art.

EP 1 219 723 A discloses a hard film for cutting tools composed of $Ti_{1-a-b-c-d}Al_aCr_bSi_cB_d(C_{1-e}N_e)$ where $0.5<a<0.8$, $b>0.06$, is $0 \leq c<0.1$, $0 \leq d<0.1$, $0<c+d<0.1$ and $0.5<e<1$. The hard film can be in the form of a multilayered structure.

US2006/0222893 discloses a multilayer coating comprising repeated layer stacks comprising at least one, 50-150 nm, (Al,Cr)N layer and/or at least one, 75-200 nm, (Ti,Si)N layer and at least one layer stack of (Al,Cr,Ti,Si)N+(Ti,Si)N+(Al,Cr,Ti,Si)N+(Al,Cr)N. The mixed (Al,Cr,Ti,Si)N layers have a multilayered structure and is achieved by running all targets simultaneously. This would lead to a coating with very fine layers, in the range of several nanometers. The (Al,Cr,Ti,Si)N layer have a thickness of 20±10 nm.

SUMMARY

It is an object of the present disclosure to provide a coated cutting tool having both high crater wear resistance and high flank wear resistance.

It is another object of the present disclosure to provide a coating having an increased hardness.

It is another object of the present disclosure to provide a coating which is suitable for sharp edges.

It is another object of the present disclosure is to provide a coated drill that will experience less wear on the margin.

It has surprisingly been found that by coating cutting tools with an aperiodic, multilayered coating with a composition as disclosed herein, these objectives can be met.

An exemplary coated cutting tool comprises a substrate and a coating, the coating including an aperiodic, multilayered structure with alternating individual metal nitride layers X and Y, and wherein the average composition of the multilayered structure is $(Ti_{(1-a-b-c)}Al_aCr_bSi_c)N$, where $0<a<0.5$, $0<b<0.15$, $0.01<c<0.17$, and $a+b+c<1$.

An exemplary method of making a coated cutting tool comprises depositing a coating on a substrate by PVD technique, wherein the coating comprises an aperiodic, multilayered structure with alternating individual metal nitride layers X and Y, and wherein an average composition of said multilayered structure is $(Ti_{(1-a-b-c)}Al_aCr_bSi_c)N$, where $0<a<0.5$, $0<b<0.15$, $0.01<c<0.17$, and $a+b+c<1$.

It is to be understood that both the foregoing general description and the following detailed description are exemplary and explanatory and are intended to provide further explanation of the invention as claimed.

BRIEF DESCRIPTION OF THE DRAWINGS

The following detailed description can be read in connection with the accompanying drawings in which like numerals designate like elements and in which.

DETAILED DESCRIPTION

Figure 1:
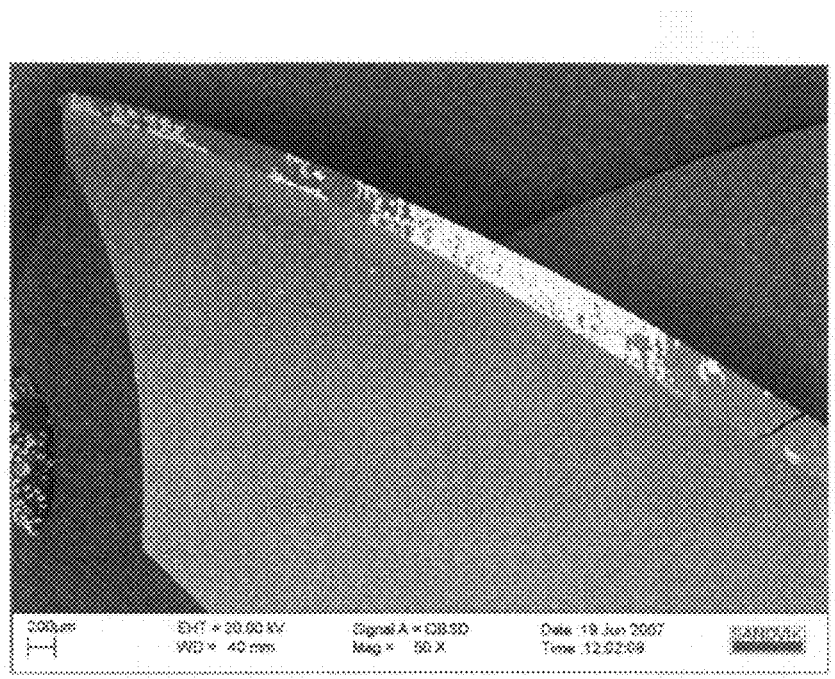
FIG. 1 shows the margin wear on a drill coated with a (Ti,Al,Cr,Si)N coating according to prior art after drilling 200 holes.
Figure 2:
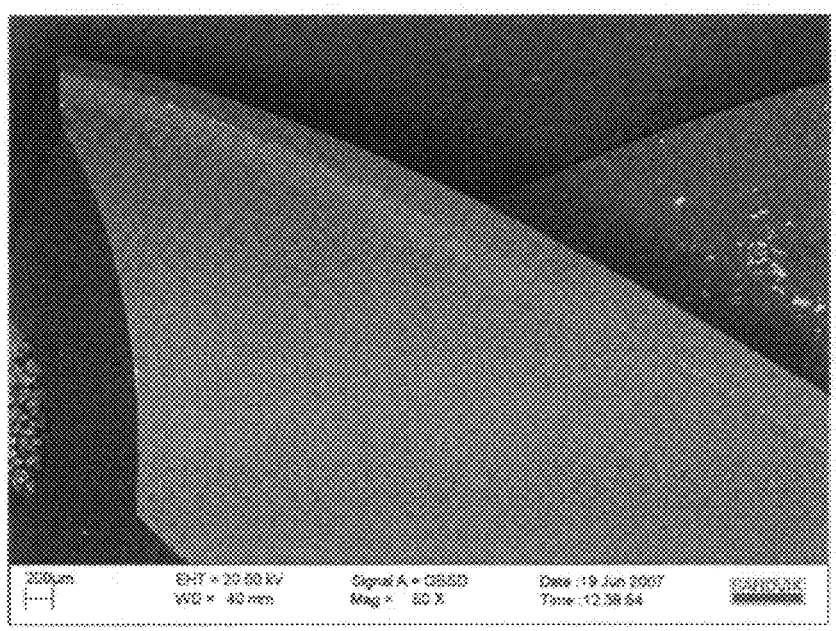
FIG. 2 shows the margin wear on a drill coated with a (Ti,Al,Cr,Si)N coating according to an exemplary embodiment of the invention after drilling 200 holes.

There is provided, according to the present disclosure, an exemplary embodiment of a coated cutting tool comprising a substrate of a hard alloy of cemented carbides, cermets, ceramics, cubic boron nitride or high speed steels and a coating comprising an aperiodic, multilayered (Ti,Al,Cr,Si)N structure with alternating X and Y individual layers.

By aperiodic it is understood that the thickness of a particular individual layer in the multilayered structure has no relation to the thickness of an individual layer immediately beneath, nor above the particular individual layer. The multilayered structure does not have any repeat period in the sequence of at least 10 consecutive individual layers.

By multilayered structure is herein meant a structure comprising at least 5 individual layers. However, it can comprise up to several thousand individual layers.

The average thickness of exemplary embodiments of the individual layers is larger than 0.1 nm but smaller than 100 nm, preferably larger than 0.5 nm, but smaller than 50 nm, most preferably larger than 1 nm, but smaller than 30 nm. The sum of any ten consecutive layers in the multilayered structure is smaller than 300 nm.

In exemplary embodiments, the total thickness of the whole coating is 0.5 to 20 µm, preferably 1 to 10 µm, most preferably 1 to 5 µm.

Said multilayered structure, which is adherently bonded to the substrate, or to a pre-coated substrate, comprises a laminar, aperiodic, multilayered structure of alternating layers X and Y where the individual layers X and Y are metalnitrides, preferably polycrystalline metalnitrides, preferably having a cubic structure, with the metal elements selected from titanium (Ti), aluminium (Al), silicon (Si), chromium (Cr) or mixtures thereof. The chemical composition of the individual layers X and Y is different from each other.

The composition of each individual layer in the multilayered structure cannot easily be measured without contribution from adjacent layers due to the low thickness. What can be measured is the average composition over the whole multilayer structure. However, the composition of each individual layer can be estimated from the composition of the targets used but that does not give an exact composition. When thicker layers have been deposited, thick enough to be analyzed, it has been shown that the composition of the deposited layers can differ with a few percentage compared to the composition of the target material. Due to this fact, any composition of the individual layers of the multilayered structure mentioned herein after is estimations from the compositions of the targets used during the deposition.

The average chemical composition in the multilayered structure is measured using EDS (Energy Dispersive Spectroscopy) over a cross section of the coating. The average composition of the whole multilayered structure is $(Ti_{(1-a-b-c)}Al_aCr_bSi_c)N$ where $0<a<0.5$, preferably $0.05<a<0.4$, most preferably $0.25<a<0.3$, where $0<b<0.15$, preferably $0.02<b<0.10$, most preferably $0.04<b<0.08$ where $0.01<c<0.17$, preferably $0.02<c<0.10$, most preferably $0.04<c<0.08$, and $a+b+c<1$.

In one exemplary embodiment, the substrate is precoated with a thin single- or multilayered coating of TiN, TiC, TiCN or (Ti,Al)N with a thickness of between 0.1-1 µm, preferably 0.05-0.5 µm.

In one exemplary embodiment, the composition of the individual layers X and Y can be any one of (Al,Cr)N, (Ti,Si)N, (Al,Ti,Si)N, TiN, (Al,Si)N (Al,Ti,Cr,Si)N.

In one exemplary embodiment, the coating comprises a multilayered structure of alternating (Al,Cr)N and (Ti,Si)N individual layers.

In one exemplary embodiment, the substrate is a cutting tool insert of cemented carbide, cermets, ceramics or cubic boron nitride.

In one exemplary embodiment, the substrate is a drill or end mill of cemented carbide or high speed steel.

The present disclosure also relates to a method of making a coated cutting tool. An exemplary embodiment of a method comprises the steps of providing a substrate of a hard alloy of cemented carbides, cermets, ceramics, cubic boron nitride or high speed steel, onto said substrate and depositing, by PVD technique, a coating comprising an aperiodic, multilayered structure.

The coating can be deposited by using targets of elements selected from titanium (Ti), aluminium (Al), silicon (Si), chromium (Cr), or alloys thereof, in an $N_2$ or mixed $N_2+Ar$ gas atmosphere.

The composition of the metal elements in the targets can be different from the average composition of the metal elements in the whole multilayered structure and still form coatings within the scope of the presently disclosed coatings.

In one exemplary embodiment, the targets are any one of (Al,Cr), (Ti,Si), (Al,Ti,Si), Ti, (Al,Si) and (Al,Ti,Cr,Si).

In one exemplary embodiment, the targets are (Al,Cr) and (Ti,Si).

The coatings comprising the multilayered structure can be deposited by different PVD techniques and alternately forming individual layers. The aperiodic sequence of the individual layer thicknesses can be made by randomly opening and closing shutters from individual layer targets, or by randomly switching said targets on and off. Another conceivable method is by randomly rotating or moving the to-be-coated substrates, in front of said targets. This is preferably done by placing the substrates on a 3-fold rotating substrate table arranged in order to obtain the aperiodic structure. The 3-fold rotation can be adjusted with regard to rotating speed and rotating direction, clockwise or counter clockwise.

The multilayered structure is deposited in such a way that the average thickness of the individual layers is larger than 0.1 nm but smaller than 100 nm, preferably larger than 0.5 nm but smaller than 50 nm, most preferably larger than 1 nm but smaller than 30 nm. The sum of any ten consecutive layers in the multilayered structure is smaller than 300 nm.

The thickness of the whole coating is 0.5 to 20 µm, preferably 1 to 10 µm, most preferably 1 to 5 µm.

The average composition of the whole multilayered structure made according to the method of the present invention is $(Ti_{(1-a-b-c)}Al_aCr_bSi_c)N$ where $0<a<0.5$, preferably $0.05<a<0.4$, most preferably $0.25<a<0.3$, where $0<b<0.15$, preferably $0.02<b<0.10$, most preferably $0.04<b<0.08$ where $0.01<c<0.17$, preferably $0.02<c<0.10$, most preferably $0.04<c<0.08$, and $a+b+c<1$.

Most PVD techniques can be used in the disclosed method, preferably electron beam evaporation, magnetron sputtering or cathodic arc deposition or combinations thereof are used.

In one exemplary embodiment, the substrate used in the method is a cutting tool insert of cemented carbide, cermets, ceramics or cubic boron nitride.

In one exemplary embodiment, the substrate used in the method is a drill or end mill of cemented carbide or high speed steel.

EXAMPLE 1

Invention

Drills with a diameter of 8 mm, ball-nosed solid end mills with a diameter of 10 mm and indexable inserts were made from cemented carbide substrates with a composition of 10 wt-% Co and balance WC. These three different types of tools were coated with an aperiodic, multilayered (Ti,Al,Cr,Si)N coating, using cathodic arc evaporation. The coating thickness was adjusted to fit the specific tool and its application. The multilayer structures were deposited from two pairs of arc targets made out of two different chemical compositions, with the tools mounted on a 3-fold rotating substrate table arranged in order to obtain the aperiodic structure. The arc evaporation was performed in an Ar+$N_2$-atmosphere. After depositing, the coating on the drills was subjected to a wet blasting treatment.

The composition of the arc targets, the average composition of the coating as measured using EDS on a coating cross-section and the coating thickness for each tool as measured using light optical microscopy on the periphery of the drill and the end mill and on the flank face of the insert are shown in Table 1.

The multilayered structure had a sequence of individual layers with an aperiodic, i.e., non-repetitive, thickness. Cross section transmission electron microscopy investigation revealed that the individual nitride layer thicknesses ranged from 1 to 30 nm, and the total number of layers in each layer system exceeded 100.

TABLE 1

| Tool | Target 1 | Target 2 | Average chemical composition | Thickness [μm] |
|---|---|---|---|---|
| Drill | $Al_{0.70}Cr_{0.30}$ | $Ti_{0.90}Si_{0.10}$ | $Ti_{0.53}Al_{0.29}Si_{0.06}Cr_{0.06}$ | 3.3 |
| End mill | $Al_{0.70}Cr_{0.30}$ | $Ti_{0.90}Si_{0.10}$ | $Ti_{0.53}Al_{0.29}Si_{0.06}Cr_{0.06}$ | 3.3 |
| Insert | $Al_{0.70}Cr_{0.30}$ | $Ti_{0.90}Si_{0.10}$ | $Ti_{0.53}Al_{0.29}Si_{0.06}Cr_{0.06}$ | 3.0 |

EXAMPLE 2

Reference

For comparison, substrates with the same shape and composition as those in Example 1, were coated with different commercial coatings.

TABLE 2

| | Coating | Substrate | Thickness (μm) |
|---|---|---|---|
| Commercial 1* | (Ti, Al, Cr, Si)N | Drill, 8 mm | 3.1 |
| | | End mill, 10 mm | 3.1 |
| Commercial 2 | Homogenous $Al_{0.70}Cr_{0.30}N$ | Drill, 8 mm | 2.4 |
| | | End mill, 10 mm | 2.4 |
| Commercial 3 | $Ti_{0.84}Al_{0.16}N$, Nanolayered | Drill, 8 mm | 2.7 |
| Commercial 4 | $Ti_{0.51}Al_{0.49}N$, Nanolayered | Insert | 4.5 |

*Produced according to US 2006/0222893.

EXAMPLE 3

Drills made according to Example 1 were compared to drills made according to Example 2. Two drills of each drill type were tested in a bottom hole drilling operation during the following cutting conditions:

| Work piece material: | SS2541-03 (34CrNiMo6) |
|---|---|
| Operation: | Drilling |
| $V_c$ [m/min] | 100 |
| Feed [mm/rev] | 0.15 |
| a, depth of hole [mm] | 20 |
| Internal coolant | yes |

The results can be seen below. The results are an average number of two tests. Tool life criterion was flank wear of $v_b$=0.3 mm, rake wear/chipping of $k_b$=0.5 mm, breakage or long chips.

TABLE 3

| Drill type No. | No. holes |
|---|---|
| Invention | 1550 |
| Commercial 1 | 525 |
| Commercial 2 | 600 |
| Commercial 3 | 1010 |

EXAMPLE 4

Drills made according to Example 1 were compared to drills made according to Example 2. Three drills of each drill type were tested in a through hole drilling operation during the following cutting conditions:

| Work piece material: | SS2244-05 (42CrMo4) |
|---|---|
| Operation: | Drilling |
| $V_c$ [m/min] | 70 |
| Feed [mm/rev] | 0.15 |
| a, depth of hole [mm] | 18 |
| Internal coolant | yes |

The results can be seen below. The results are an average number of three tests. Tool life criterion was flank wear of $v_b$=0.3 mm, rake wear or chipping of $k_b$=0.5 mm, breakage or long chips.

TABLE 4

| Drill type No. | No. holes |
|---|---|
| Invention | 1300 |
| Commercial 1 | 200 |
| Commercial 2 | 700 |
| Commercial 3 | 573 |

EXAMPLE 5

Ball-nosed solid end mills, 10 mm in diameter, for machining hardened steel made according to Example 1 and were compared to a ball-nosed solid end mill made according to example 2. Two end mills of each type were tested in a milling operation during the following cutting conditions:

| Work piece material: | 1.2379 52HRC, hardened steel |
|---|---|
| Operation: | contour test milling |
| $a_e$ [mm] | 0.2 |
| $a_p$ [mm] | 0.2 |
| $V_c$ [m/min] | 196 |
| $f_z$ [mm/tooth] | 0.127 |
| Coolant | Compressed air |

The results can be seen below. Tool life criterion was average flank wear, $v_b$, of 0.15 or a maximum flank wear $V_{b,max}$ of 0.20 mm.

TABLE 5

| End mill | Milled distance (m) |
|---|---|
| Invention | 720 |
| Commercial 1 | 450 |

EXAMPLE 6

Indexable inserts made according to Example 1 were compared to indexable inserts according to Example 2. Two indexable inserts of each type were tested in a milling operation during the following cutting conditions:

| Work piece material: | Dievar 47HRC, hardened steel |
| --- | --- |
| Operation: | Milling |
| $V_c$ [m/min] | 120 |
| $a_e$ [mm] | 2.0 |
| $a_p$ [mm] | 4.0 |
| $f_z$ [mm/tooth] | 0.12 |

The results can be seen below. The results are an average number of two tests. Tool life criterion was $v_b$ of 0.2 mm or chipping or notch wear of 0.3 mm.

TABLE 6

| Insert No. | Milled distance (m) |
| --- | --- |
| Invention | 40.25 |
| Commercial 4 | 13.1 |

Although described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A coated cutting tool comprising a substrate and a coating, the coating including an aperiodic, multilayered structure with alternating individual metal nitride layers X and Y,
    wherein an average composition of the multilayered structure is:

(Ti$_{(1-a-b-c)}$Al$_a$Cr$_b$Si$_c$)N where $0<a<0.5$, $0<b<0.15$, $0.01<c<0.17$, and $a+b+c<1$, and
    wherein the multilayered structure comprises alternating (Ti, Si)N and (Al, Cr)N individual layers.

2. The coated cutting tool according to claim 1, wherein an average thickness of the individual layers is 0.1 to 100 nm.

3. The coated cutting tool according to claim 2, wherein the average thickness is larger than 0.5 nm and smaller than 50 nm.

4. The coated cutting tool according to claim 2, wherein a sum of any ten consecutive layers in the multilayered structure is smaller than 300 nm.

5. The coated cutting tool according to claim 1, wherein a thickness of the whole coating is 0.5 to 20 μm.

6. The coated cutting tool according to claim 1, wherein $0.05<a<0.4$, $0.02<b<0.10$ and $0.02<c<0.10$.

7. The coated cutting tool according to claim 1, wherein X and Y are different from each other.

8. The coated cutting tool according to claim 1, wherein the metalnitrides have a cubic structure.

9. The coated cutting tool according to claim 8, wherein a metal element of the metalnitrides is selected from the group consisting of Ti, Al, Si, Cr and mixtures thereof.

10. The coated cutting tool according to claim 1, wherein $0.05<a<0.4$.

11. The coated cutting tool according to claim 1, wherein $0.02<b<0.10$.

12. The coated cutting tool according to claim 1, wherein $0.02<c<0.10$.

13. The coated cutting tool according to claim 1, including a precoating of a single- or multilayered coating of TiN, TiCN of (Ti, Al)N having a thickness of between 0.1 to 1 μm.

14. The coated cutting tool according to claim 1, wherein the substrate includes cemented carbide, cermet, ceramic or cubic boron nitride.

15. The coated cutting tool according to claim 1, wherein the substrate is a drill or end mill or cemented carbide or high speed steel.

16. method of making a coated cutting tool comprising depositing a coating on a substrate by PVD technique, wherein the coating comprises an aperiodic, multilayered structure with alternating individual metal nitride layers X and Y, and wherein an average composition of said multilayered structure is (Ti$_{(1-a-b-c)}$Al$_a$Cr$_b$Si$_c$)N, where $0<a<0.5$, $0<b<0.15$, $0.01<c<0.17$, and $a+b+c<1$, and wherein the multilayered structure comprises alternating (Ti, Si)N and (Al, Cr)N individual layers.

17. The method according to claim 16, wherein an average thickness of the individual layers is 0.1 to 100 nm.

18. The method according to claim 16, wherein $0.05<a<0.4$, $0.02<b<0.10$ and $0.02<c<0.10$.

19. The method according to claim 16, wherein the multilayered structure has been deposited by using (Ti, Si) and (Al, Cr) targets.

20. The coated cutting tool according to claim 1, wherein $0<b<0.10$.

* * * * *